United States Patent
Beesley et al.

(10) Patent No.: US 10,420,213 B2
(45) Date of Patent: Sep. 17, 2019

(54) SEGMENTED VIA FOR VERTICAL PCB INTERCONNECT

(71) Applicant: Apple Inc., Cupertino, CA (US)

(72) Inventors: Mark J. Beesley, Carmel Valley, CA (US); Albert A. Onderick, II, Sunnyvale, CA (US); Anne M. Mason, Palo Alto, CA (US); Craig A. Gammel, Campbell, CA (US); Shawn X. Arnold, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/696,102

(22) Filed: Sep. 5, 2017

(65) Prior Publication Data

US 2019/0075653 A1   Mar. 7, 2019

(51) Int. Cl.
| | |
|---|---|
| *H05K 1/11* | (2006.01) |
| *H05K 3/00* | (2006.01) |
| *H05K 3/42* | (2006.01) |
| *H05K 1/14* | (2006.01) |

(52) U.S. Cl.
CPC .......... *H05K 1/112* (2013.01); *H05K 3/0017* (2013.01); *H05K 3/0047* (2013.01); *H05K 3/425* (2013.01); *H05K 1/11* (2013.01); *H05K 1/14* (2013.01); *H05K 2201/0959* (2013.01); *H05K 2201/09227* (2013.01); *H05K 2201/10734* (2013.01)

(58) Field of Classification Search
CPC ...... H05K 1/112; H05K 3/0047; H05K 3/425; H05K 3/0017; H05K 2201/09227; H05K 2201/10734; H05K 2201/0959
See application file for complete search history.

(56) References Cited

U.S. PATENT DOCUMENTS

| | | | |
|---|---|---|---|
| 4,543,715 A | 10/1985 | Iadarola et al. | |
| 6,137,064 A | 10/2000 | Kiani et al. | |
| 6,891,272 B1 | 5/2005 | Fjelstad et al. | |
| 9,603,255 B2 | 3/2017 | Tourne | |
| 2004/0251047 A1* | 12/2004 | Bartley | H05K 1/115 174/262 |
| 2007/0033457 A1* | 2/2007 | Park | H05K 1/115 714/724 |

(Continued)

FOREIGN PATENT DOCUMENTS

WO   2007/086961 A2   8/2007

OTHER PUBLICATIONS

Starkey, Pete, "Vertical Conductive Structures—a New Dimension in High-Density Printed Circuit Interconnect," The PCB Magazine, Feb. 2017, pp. 16-20.

*Primary Examiner* — Ishwarbhai B Patel
(74) *Attorney, Agent, or Firm* — Kilpatrick Townsend & Stockton, LLP

(57) ABSTRACT

Printed circuit boards having an increased density of vertical interconnect paths, as well as methods for their manufacture. One example may provide a printed circuit board having an increased density of vertical interconnect paths by forming a plurality of segmented vias. The segmented vias may extend through interior layers of the printed circuit board. The segmented vias may be formed of portions of vias in the interior layers of the printed circuit board. An area between three or more segmented vias may be filled with resin or other material or materials.

20 Claims, 19 Drawing Sheets

(56) References Cited

U.S. PATENT DOCUMENTS

| | | | |
|---|---|---|---|
| 2007/0089292 A1* | 4/2007 | Tourne | H05K 1/114 |
| | | | 29/852 |
| 2007/0089902 A1* | 4/2007 | Tourne | H05K 1/114 |
| | | | 174/262 |
| 2007/0137891 A1* | 6/2007 | Fan | H05K 1/115 |
| | | | 174/262 |
| 2007/0143995 A1 | 6/2007 | Tourne | |
| 2009/0233461 A1* | 9/2009 | Tourne | H05K 1/024 |
| | | | 439/65 |

* cited by examiner

SEGMENTED VIA FOR VERTICAL PCB INTERCONNECT

BACKGROUND

The number and types of electronic devices available to consumers have increased tremendously the past few years and this increase shows no signs of abating. Electronic devices such as portable computing devices, tablet, desktop, and all-in-one computers, smart phones, storage devices, portable media players, navigation systems, monitors, and other devices have become ubiquitous.

The functionality of these devices has increased as communications, global positioning, graphics, and other types of circuits have been added. At the same time, these electronic devices have been getting smaller. As a result, the functional density of these electronic devices continues to increase.

Much of the increase in functional density that has been achieved is due to the increase in functionality of integrated circuits and modules, particularly with system on an integrated circuit (SOIC), system in package (SIP) modules, and other high-density circuits. These circuits and modules are often connected to printed circuit boards through an array of contacts, for example by a ball grid array (BGA.)

The contacts of a BGA may be soldered to contacts on a printed circuit board of the electronic device. The printed circuit board contacts may connect to traces in the printed circuit board. These traces may form electrical pathways for signals and power.

It may be difficult to route these traces in an area below an SOIC, SIP, or other high-density circuit. Specifically, while a printed circuit board may contain several layers on which traces may be routed horizontally, it may be difficult to form the necessary vertical paths. Typically, vias are used, but the required spacing between vias may be large enough that forming a sufficient number of vias may be problematic.

Thus, what is needed are printed circuit boards having an increased density of vertical interconnect paths, as well as methods for their manufacture.

SUMMARY

Accordingly, embodiments of the present invention may provide printed circuit boards having an increased density of vertical interconnect paths, as well as methods for their manufacture.

An illustrative embodiment of the present invention may provide a printed circuit board having an increased density of vertical interconnect paths by forming a number of segmented vias. The segmented vias may extend through several layers of the printed circuit board. The segmented vias may be formed of portions of vias or through-holes in the printed circuit board. An area between three or more segmented vias may be filled with resin or other material or materials.

In these and other embodiments of the present invention, a printed circuit board may include a number of traces. The traces may be formed of horizontal sections on the surfaces of a number of layers of the printed circuit board and vertical sections routed among the layers. The vertical sections may include segmented vias including a first segmented via, a second segmented via, and a third segmented via. A region of resin fill or other material may be located between the first segmented via and the second segmented via, where the first segmented via is spaced from the second segmented via in a first direction, and between the first segmented via and the third segmented via, where the first segmented via is spaced from the third segmented via in a second direction, and where the first direction is orthogonal to the second direction.

These segmented vias may be formed in various ways. In these and other embodiments of the present invention, first holes may be formed in several layers of a printed circuit board. Each of the first holes may extend through the several layers of the printed circuit board. The first holes may be plated to form vias, and then filled. Before filling, the plated vias may be etched, for example with a chemical etch, to improve adhesion of the fill material to the plated vias. The plated vias may then be segmented. In these and other embodiments of the present invention, the vias may be segmented by forming second holes in the printed circuit board, each of the second holes between adjacent first holes or adjacent to and overlapping first holes. Each of the second holes may extend through the several layers of the printed circuit board. The second holes may then be filled. The first holes and the second holes may be formed by drilling, by using a laser, or other appropriate technique.

In these and other embodiments of the present invention, one or more additional layers may be laminated onto the several layers of the printed circuit board to form a completed printed circuit board. For example, a limited number of layers, such as one, two, or three layers, may be laminated onto the top, bottom, or both the top and bottom of the several layers of the printed circuit board. In other examples, a larger number of layers, such as two, three, four, five, six, seven, or more layers may be laminated onto the top, bottom, or both the top and bottom of the several layers of the printed circuit board The several layers of the printed circuit board may be referred to as the printed circuit board core, and the segmented vias may form vertical pathways through the printed circuit board core. The segmented vias in such a board may be referred to as buried segmented vias since they do not reach the top or bottom surfaces of the finished printed circuit board.

In these and other embodiments of the present invention, the first holes and the second holes may be filled with resin or other material or materials. In these and other embodiments of the present invention, the first holes and the second holes may be filled with the same or different materials. For example, since the first holes are plated, they may be filled with a material that provides good adhesion to a metal plated surface, while since the second holes are not plated, they may be filled with a material that provides good adhesion to an inside surface of a hole in a printed circuit board and to the material used to fill the first holes. Also, since the material used to fill the first holes may be drilled to form the second holes and the material used to fill the second holes might not be subsequently drilled, the material used to fill the first holes may be selected with the second drilling as a consideration, whereas the material used to fill the second holes may be selected without the second drilling as a consideration.

In these and other embodiments of the present invention, the material used to fill the first holes and the second holes may be selected to have a similar coefficient of thermal expansion as the remainder of the printed circuit board. This may help to avoid separation due to exposure to extreme temperatures. Other factors, such as dielectric constants, may be considered.

In these and other embodiments of the present invention, contacts may be formed on a top, bottom, or both a top and bottom of the printed circuit board. The contacts may electrically connect to the segmented vias. The contacts may be contacts for mating with, or connecting to, a ball grid array or other contact arrangement for an SOIC or SIP module or other high-density circuit.

In these and other embodiments of the present invention, it may be of particular importance to properly align the locations of the second holes to the first holes. In the event that the second holes are shifted in a direction along a line of the first holes, bridging between segmented vias may occur. In the event that second holes are shifted in a lateral direction relative to the first holes, the segmented vias may become mismatched in size. This mismatch in size may cause a mismatch in trace impedance. When the segmented vias are used to convey a differential signal, this mismatch in impedance may lead to an increase in coupling to other traces, an increase in susceptibility to coupling from other traces, as well as timing skews and insertion losses. Accordingly, embodiments of the present invention may employ an optical system for aligning the second holes to the first holes. The optical system may utilize CCD and other technologies for improved alignment.

Various materials may be used to form the various features of printed circuit boards according to embodiments of the present invention. For example, the conductive layer used to form vias and segmented vias may be copper, aluminum, gold, or combination of these and other conductive materials. The horizontal sections may be formed of copper, aluminum, gold, or combination of these and other conductive materials. The printed circuit boards may be formed of FR4 or other more advanced materials. The first and second holes may be filled with resin, epoxy, or other material. For example, a material referred to as PHP900 by San-ei Kaguku Co. Ltd., of Japan may be used to fill the first and second holes.

Embodiments of the present invention may provide printed circuit boards that may be included in various types of devices, such as portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, and other devices.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
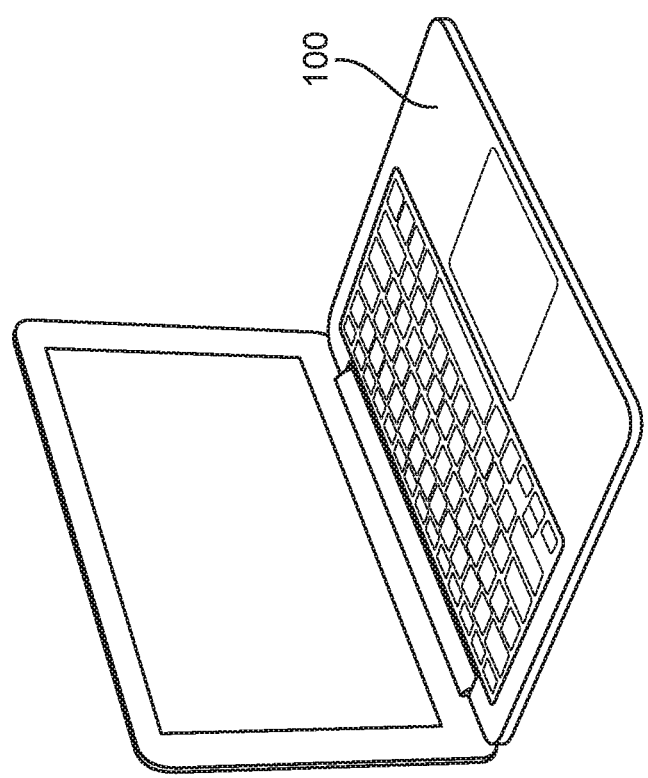
FIG. 1 illustrates an electronic system that may be improved by the incorporation of embodiments of the present invention.

FIG. 1 illustrates an electronic system that may be improved by the incorporation of an embodiment of the present invention. This figure, as with the other included figures, is shown for illustrative purposes and does not limit either the possible embodiments of the present invention or the claims.

This example illustrates a portable computing device, a laptop 100, that may include a printed circuit board according to an embodiment of the present invention. In other embodiments the present invention, other types of devices may include printed circuit boards according to an embodiment of the present invention. For example, laptop 100 may instead be a tablet computer, desktop computer, all-in-one computer, wearable computing device, smart phone, storage device, portable media player, navigation system, monitor, power supply, video delivery system, adapter, remote control device, charger, or other device.

Again, devices, such as laptop 100, have become more complicated over time and have a higher level of functionality as communication, global positioning, graphics, larger memories, and other types of circuits have been added. Much of this increase in functional density that has been achieved is due to an increase in functionality of integrated and other circuits and modules, particularly with SOICs, SIP modules, and other high-density circuits. These circuits and modules are often connected to printed circuit boards via an array of contacts on the SOICs and SIP modules, for example by a BGA. The contacts of the BGA may be soldered to contacts on a printed circuit board of the electronic device. The printed circuit board contacts may connect to traces in the printed circuit board. These traces may form electrical pathways for signals and power.

But it may be difficult to route these traces in an area below an SOIC, SIP, or other high-density circuit. Specifically, while a printed circuit board may contain several layers on which traces may be routed horizontally, it may be difficult to form the necessary vertical paths. That is, while additional horizontal layers may be added for more horizontal routing, this does not directly aid in providing more vertical routing. Typically, vias are used, but the required spacing between vias may be large enough that forming a sufficient number of vias in a given space may be problematic. Accordingly, embodiments of the present invention may provide printed circuit boards having an increased density of vertical interconnect paths, as well as methods for their manufacture. Examples of such vertical interconnect are shown in the following figures.

Figure 2:
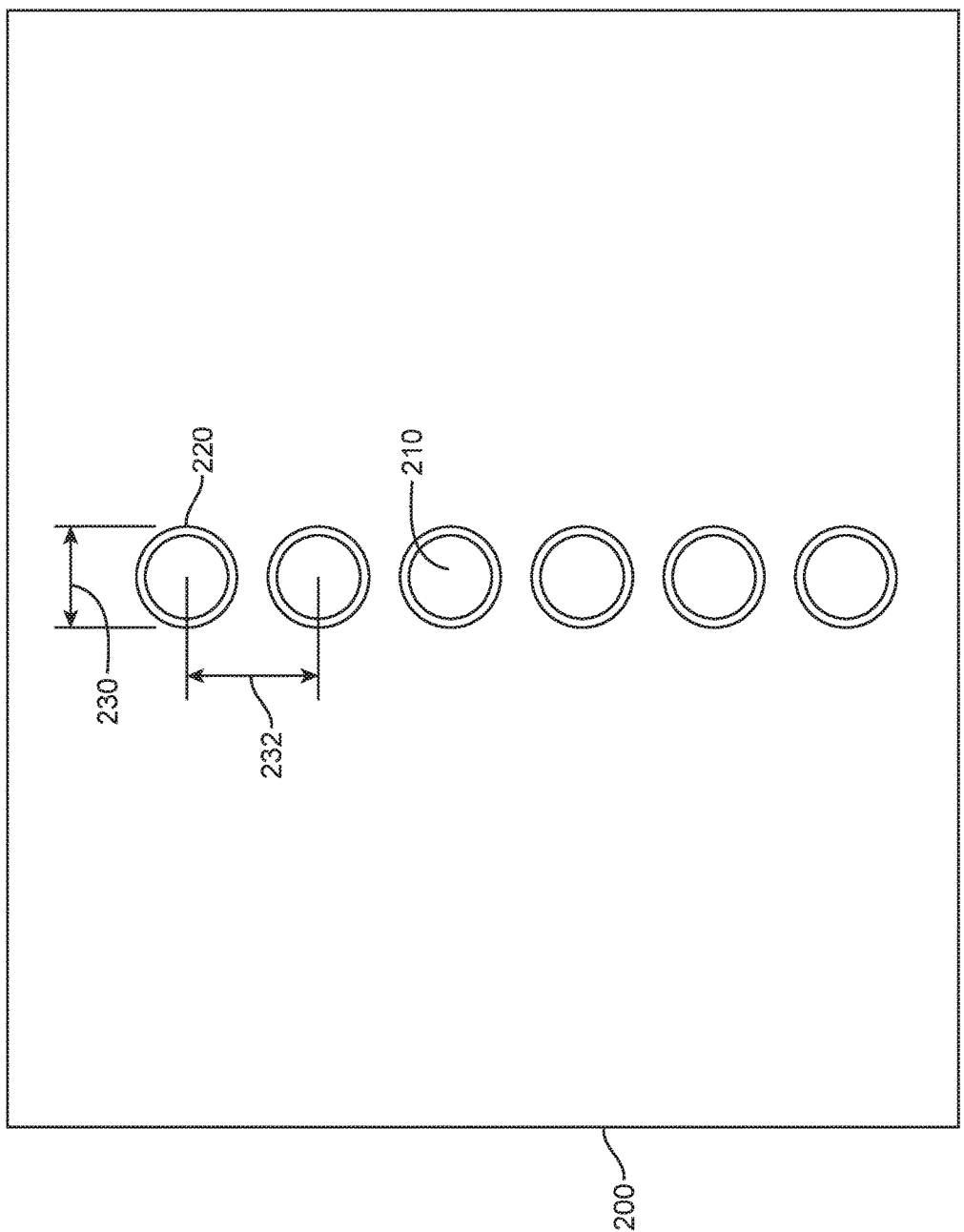
FIGS. 2-4 illustrate a method of forming segmented vias according to an embodiment of the present invention.
Figure 3:
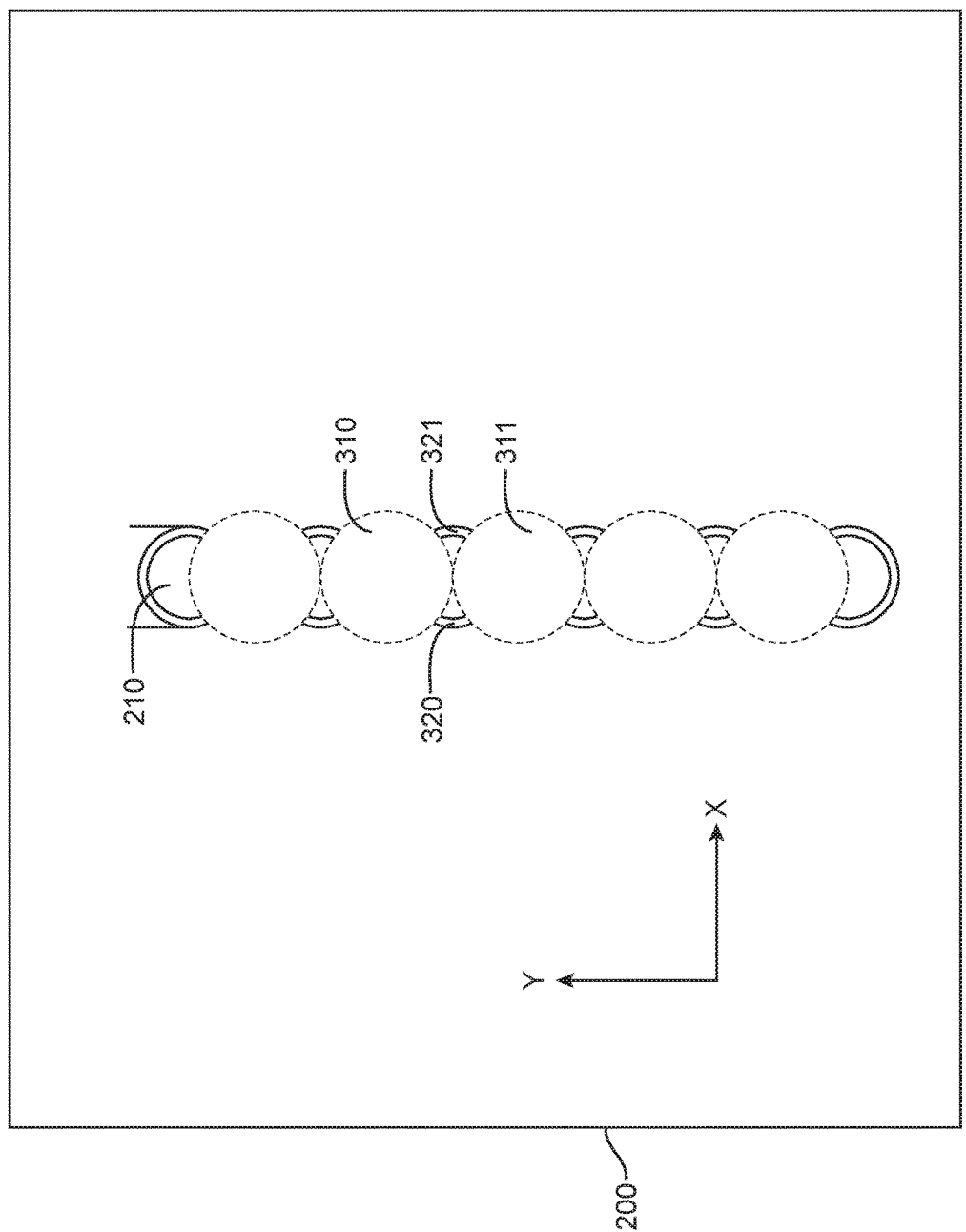
Figure 4:
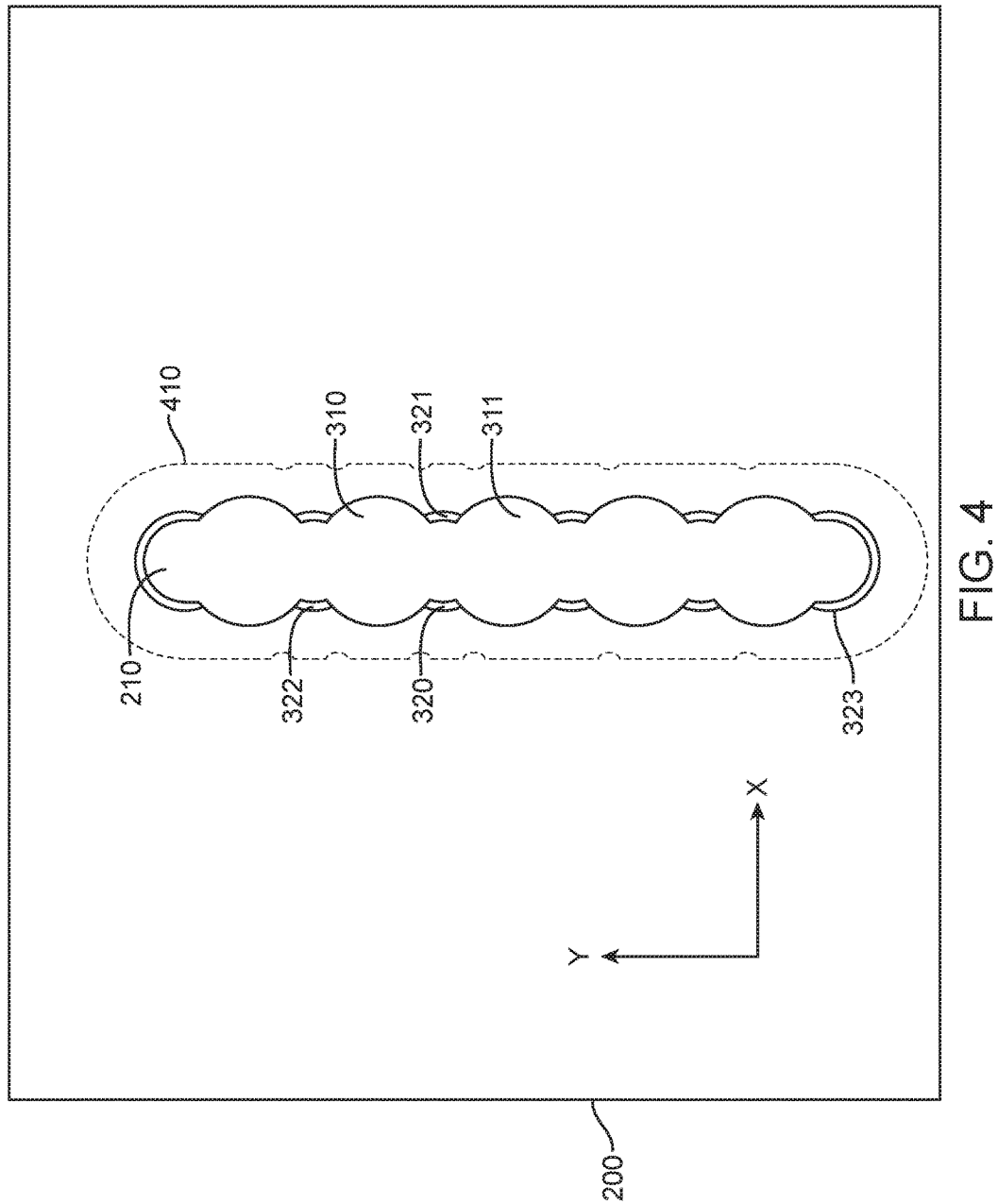

FIGS. 2-4 illustrate a method of forming segmented vias according to an embodiment of the present invention. In FIG. 2, first holes 210 may be formed. First holes 210 may extend through several layers of printed circuit board 200, that is, first holes 210 may extend through the core layers of a printed circuit board 200. In these and other embodiments of the present invention, first holes 210 may extend from a top surface to a bottom surface of a core of printed circuit board 200. First holes 210 may be formed by drilling, by laser, or by other appropriate method. After formation, first holes 210 may be cleared of debris, for example with an air blast or other technique. First holes 210 may then be plated with a conductive layer to form vias 220. After plating, first holes 210 may be filled with a resin or other material. This filling may be done using a vertical vacuum plug or other method. Before filling, an inside surface of vias 220 may be etched to promote adhesion with the resin or other fill material. This etching may be a chemical or other type of etch or micro-etch. After filling, top and bottom surfaces of printed circuit board 200 may be planarized. This planarization or leveling may be done by sanding or other chemical or mechanical technique.

Vias 220 may have various sizes and spacings in embodiments of the present invention. For example, vias 220 may have a diameter 230 that is at least approximately 100 to 300 μm, 200 to 400 μm, 200 μm, 300 μm, 400 μm, or more than 400 μm. Vias 220 may have a center-to-center spacing 232 that is at least approximately 200 to 400 μm, 300 to 500 μm, 300 μm, 400 μm, 500 μm, or more than 500 μm. While each first hole 210 is shown as having the same size, some or all of first holes 210 may be of different sizes.

In FIG. 3, second holes 310 may be formed in printed circuit board 200. Second holes 310 may extend through the layers of the core of printed circuit board 200. Second holes 310 may have a greater diameter than first holes 210, though in these and other embodiments of the present invention, second holes 310 may have the same or a smaller diameter than first holes 210. While each second hole 310 is shown as having the same size, some or all of second holes 310 may be of different sizes. Second holes 310 may be of sufficient size that they meet or overlap, or they may be small enough that a space remains between adjacent second holes 310.

In these and other embodiments of the present invention, second holes 310 may extend from a top surface to a bottom surface of the core of printed circuit board 200. Second holes 310 may be formed by drilling, by laser, or by other appropriate method. After formation, second holes 310 may be cleared of debris, for example with an air blast or other technique.

Second holes 310 may then be filled with a resin or other material. This filling may be done using a vertical vacuum plug or other method. Before filling, an inside surface of second holes 310 may be etched to promote adhesion with the resin or other fill material. In particular, exposed edges of segmented vias 320 may be etched to remove burrs or other sharp edges. This etching may be a chemical or other type of etch or micro-etch. After filling, top and bottom surfaces of printed circuit board 200 may be planarized. This planarization may again be done by sanding or other chemical or mechanical technique.

Second holes 310 may be formed at locations between adjacent first holes 210. Second holes 310 may also be formed at locations at an end of a row or line of first holes 210. In this way, holes 310 may cut into vias 220, leaving behind segmented vias 320. Specifically, two segmented vias 320 may be formed from each via 220. In this example, second holes 310, identified here as holes 310 and 311, may be formed on each side of via 220, thereby forming segmented vias 320 and 321.

In these and other embodiments of the present invention, the same or different materials may be used to fill first holes 210 and second holes 310. For example, first holes 210 may be filled with a first material that adheres well to the plated surface of vias 220. Second holes 310 may be filled with a second material that adheres well to in inside surface of a hole in a printed circuit board material. The first and second materials may also be selected to adhere well to each other and to have a coefficient of thermal expansion that matches well to each other and to a printed circuit board material. These factors may help to avoid separations and cracks in printed circuit board 200. Also, first holes 210 may be at least partially drilled or removed when second holes 310 are formed. Conversely, second holes 310 might remain intact and not drilled. For this reason, the first material may be chosen to permit accurate drilling and formation of second holes 310, reduced drill bit wear, and other such factors, while the second material used to fill second holes 310 might face no such constraint. Other factors, such as the dielectric constants of the materials, may need to be considered.

In the example of FIG. 3, segmented vias 320 and 321 may be separated by a region formed at least primarily of the first material. Segmented vias 320 and 322 may be separated by a region formed at least primarily of the second material. In this example, segmented vias 320 and 321 may be separated from each other in a first direction (horizontally across the page in the X direction), while segmented vias 320 and 322 may be separated from each other in a second direction (vertically up the page in the Y direction), where the first direction is at least approximately orthogonal to the second direction.

In FIG. 4, first holes 210 and second holes 310 have been filled and a number of segmented vias 320 have been formed in printed circuit board 200. The array of segmented vias 320 may be referred to here as segmented via array 410. In this example, via portions 323 were left intact. In these and other embodiments of the present invention, via portions 323 may be bifurcated or otherwise divided into two portions by an additional second hole 310 at the end or ends of this line of vias. After the segmented vias have been formed, additional layers may be laminated to the top and bottom of the printed circuit board core to form the printed circuit board 200.

In these and other embodiments of the present invention, it may be of particular importance to properly align the location of second holes 310 to first holes 210 and vias 220. This may be particularly true when segmented vias 320 and 321, which again were formed from a single via 220, are used to convey a differential signal. In the event that second holes 310 are shifted in the Y direction relative to first holes 210, bridging between segmented vias 320 and 321 may occur. In the event that second holes 310 are shifted in the X direction relative to first holes 210, segmented vias 320 and 321 may become mismatched in size. This mismatch in size may cause a mismatch in trace impedance. When segmented vias 320 and 321 are used to convey a differential signal, this mismatch in impedance may lead to an increase in coupling to other traces, an increase in susceptibility to coupling from other traces, as well as timing skews and insertion losses.

Accordingly, embodiments of the present invention may employ an optical system for aligning second holes 310 to first holes 210. The optical system may utilize CCD and other technologies for improved alignment.

Figure 5:
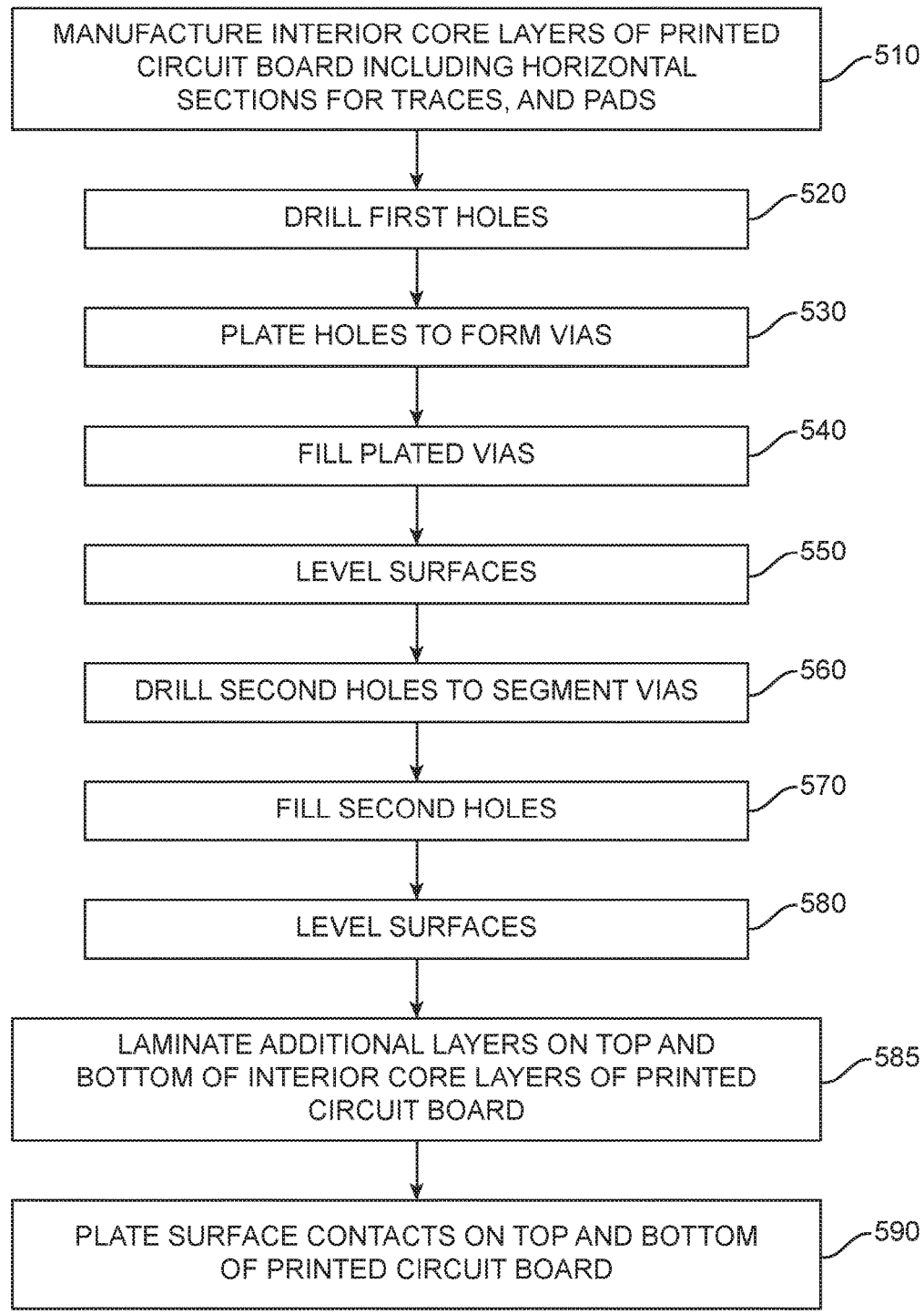
FIG. 5 is a flowchart of a method of manufacturing a printed circuit board according to an embodiment of the present invention.

FIG. 5 is a flowchart of a method of manufacturing a printed circuit board according to an embodiment of the present invention. The interior or core layers of a printed circuit board may be formed in act 510. These interior core layers may include horizontal sections for what will eventually become traces in the printed circuit board. These interior core layers may also include pads for connecting the eventual segmented vias to the horizontal trace sections. First holes may be drilled in act 520. Again, these first holes may be drilled or otherwise formed with a mechanical drill bit, laser, or other appropriate tool. The first holes may be cleared, for example the air blast or other technique, after drilling.

In act 530, the first holes may be plated to form vias. The first holes may be filled in act 540. Before filling, the inside surfaces of the vias may be micro-etches to promote adhesion to the filling material. The surfaces of the printed circuit board may be leveled in act 550. This may be done with a sander or other chemical or mechanical technique. The second holes may be drilled in act 560 in order to segment the vias. The resulting segmented vias may become vertical sections for traces in the printed circuit board. The second holes may be filled in act 570.

Again, the materials used to fill the first holes and the second holes may be the same or different. These may be different because they may adhere to different materials on the inside surface of the respective holes. Specifically, the first holes may be filled with a material that adheres well to the plating of the vias, while the second holes may be filled with material that appeared well to an inside surface of printed circuit board material and the first material. Also, the first holes may be drilled again so an appropriate material may be chosen, for example to reduce wear on a drill bit. Conversely, the second holes are typically not drilled and are therefore not subject to this consideration.

The top and bottom surfaces of the printed circuit board core may be leveled in act 580. Again, this leveling or planarization may be done by sanding or other mechanical or chemical technique. Additional layers may be laminated onto the top, bottom, or both the top and bottom of the printed circuit board core in act 585. Contacts may then be formed on the top and the bottom of the printed circuit board. These contacts may form electrical connections with at least some of the segmented vias formed in the printed circuit board. Other segmented vias may be utilized as vertical interconnect, test points, and the like, and might not be connected to a contact, at least directly.

The segmented via arrays 410 may be arranged on a printed circuit board in various ways. Examples are shown in the following figures.

Figure 6:
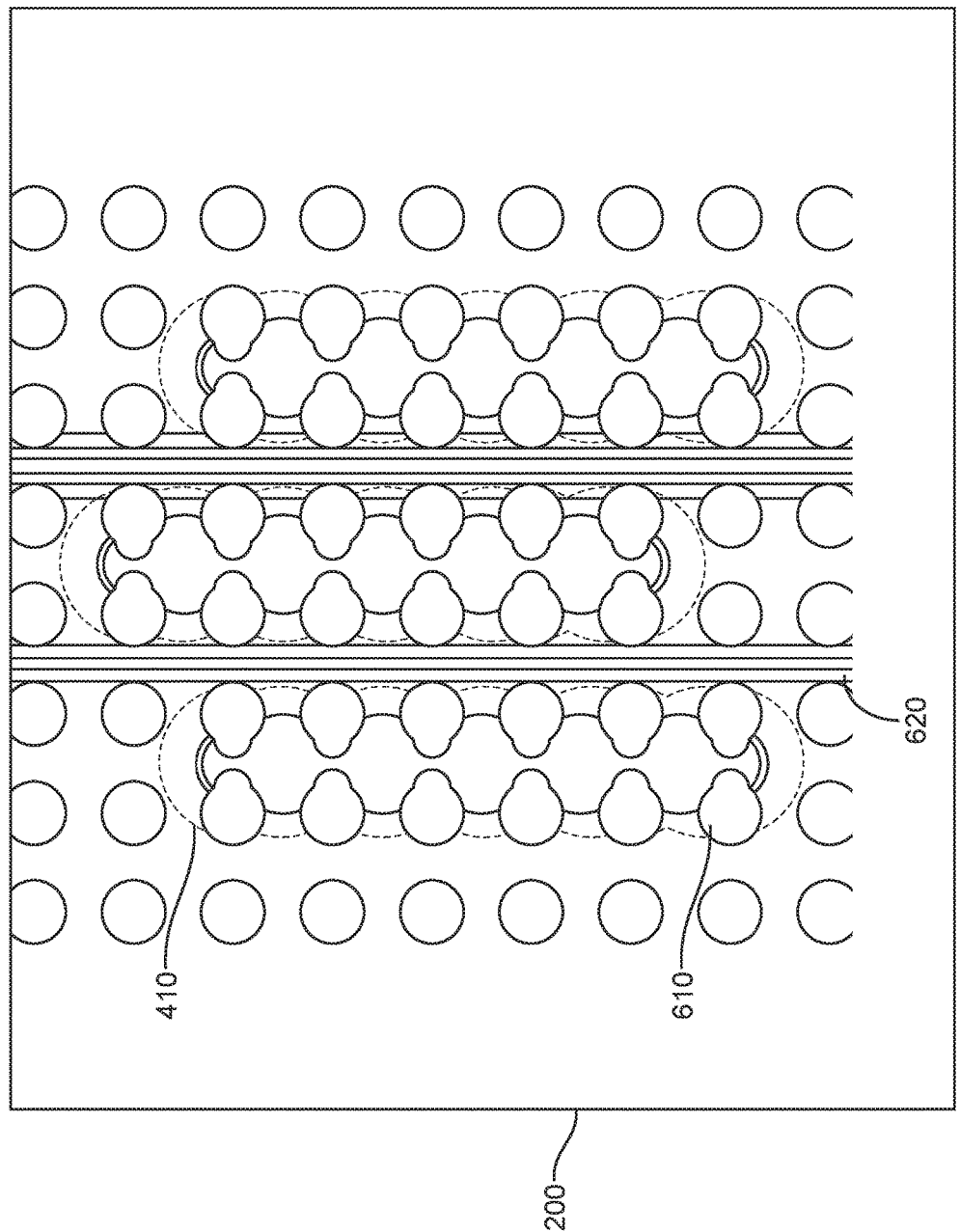
FIG. 6 illustrates a portion of a printed circuit board according to an embodiment of the present invention.

FIG. 6 illustrates a portion of a printed circuit board according to an embodiment of the present invention. In this example, multiple segmented via arrays 410 have been formed in printed circuit board 200. Each of the segmented vias may be directly contacted by a contact 610, which may be located over each segmented via. Interconnect route paths (horizontal sections 620) may be located between segmented via arrays 410.

In this example, each segmented via is shown directly connected to a contact 610. In other embodiments of the present invention, at least some of the segmented vias may not be directly contacted by a contact 610. Again, these segmented vias may be used as vertical interconnect, as test points, or for other purposes.

Figure 7:
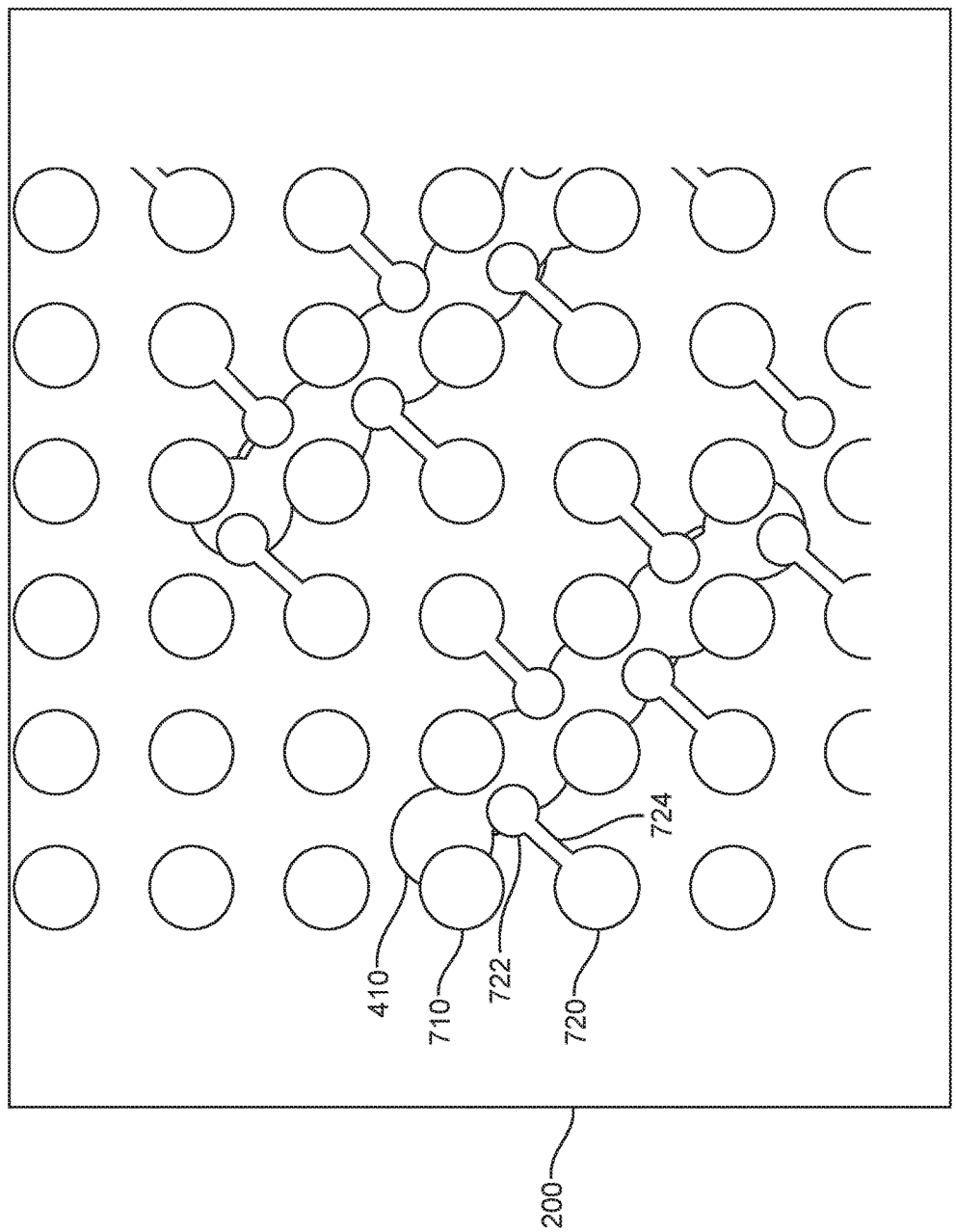
FIG. 7 illustrates a portion of a printed circuit board according to an embodiment of the present invention.

FIG. 7 illustrates a portion of a printed circuit board according to an embodiment of the present invention. In this example, segmented via arrays 410 have been formed in printed circuit board 200. Segmented via arrays 410 may be placed at a 45 degree or other angle relative to sides of printed circuit board 200. Contacts 710 may be placed directly over segmented vias, while contacts 720 may be offset from the segmented vias and may electrically connect to the segmented vias via bridge 724 and junction 722.

Figure 8:
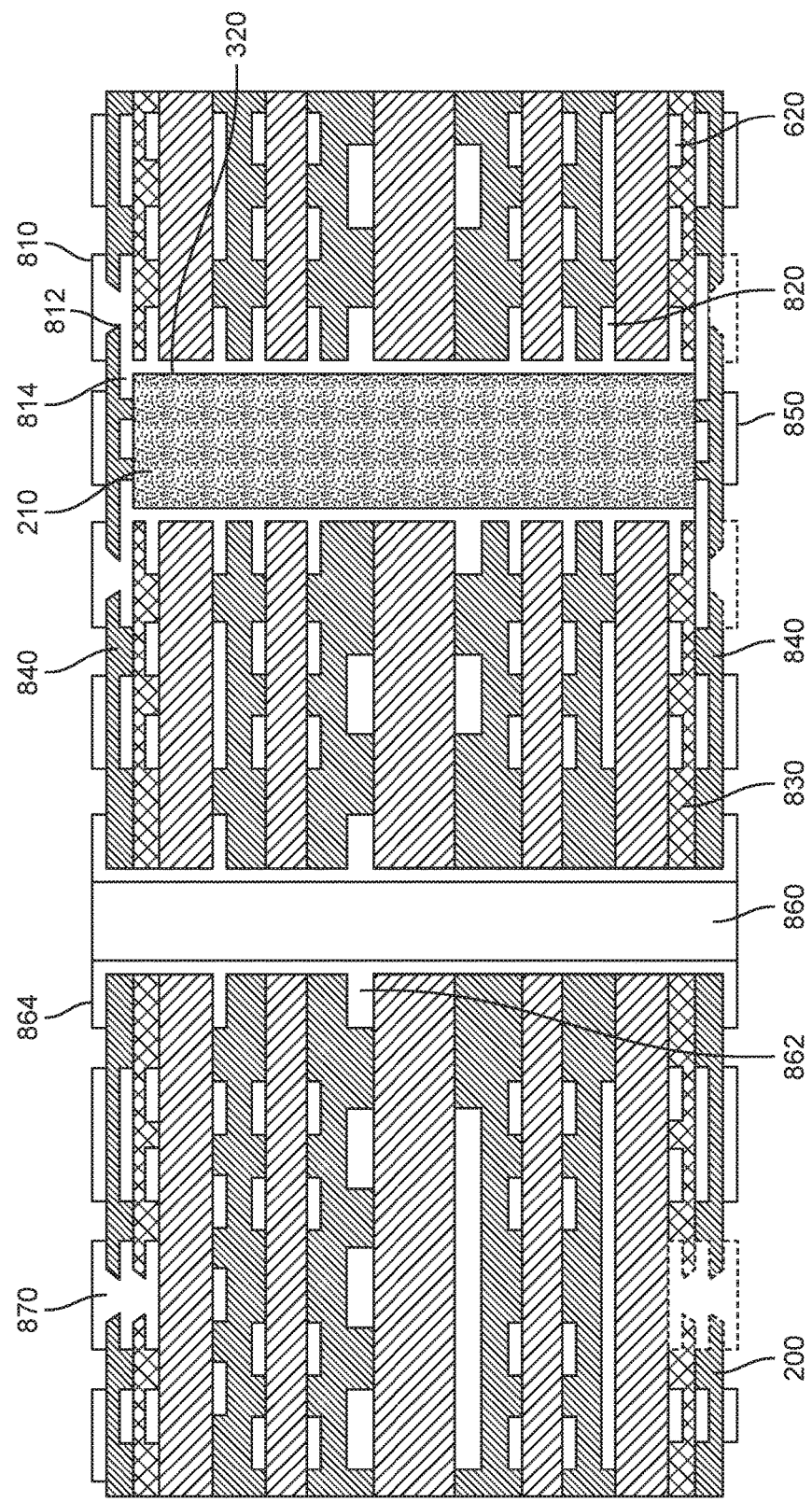
FIG. 8 illustrates a cutaway side view of a printed circuit board according to an embodiment of the present invention

FIG. 8 illustrates a cutaway side view of a printed circuit board according to an embodiment of the present invention. Printed circuit board 200 may include a number of interior layers 830. Interior layers 830 may form a core of printed circuit board 200. Interior layers 830 may include horizontal traces 620, pads 820 and 862, and other structures. Segmented vias 320 may be formed by drilling a first hole 210 in interior layers 830 and plating the resulting hole. The hole may then be filled. The resulting plating may be segmented into segmented vias 320 by drilling second holes 310, as shown above. Connecting portions 814 may be plated on a top and bottom of the printed circuit board core formed by interior layers 830. Connecting portions 814 may electrically connect to segmented vias 320. Buried vias 320 are shown as being segmented here. In these and other embodiments of the present invention, one or more buried vias may be left intact and not segmented.

Additional layers 840 may then be laminated on a top, bottom, or both top and bottom of printed circuit board 200. Through-hole via 860 may be formed by drilling and plating. Pads 864 may be formed on layers 840. Traces 850 and contacts 810 may be formed on a top and bottom of printed circuit board 200. Vias 812 in layers 840 may connect connecting portion 814 to contacts 810. These vias may be aligned with vias on adjacent layers to form stacked vias 870. In various embodiments of the present invention, printed circuit board may have various numbers of layers. For example, printed circuit board 200 may have 5-12, 10-15, 12-20, 12, 14, 16, 18, or more than 20 interior layers 830. Printed circuit board 200 may also have 1, 2, 3, 4, 5, 6, 7, 8, or more than 8 additional layers 840 laminated on interior layers 830.

Printed circuit board 200 may be formed in various ways according to these and other embodiments of the present invention. Examples are shown in the following figures.

Figure 9:
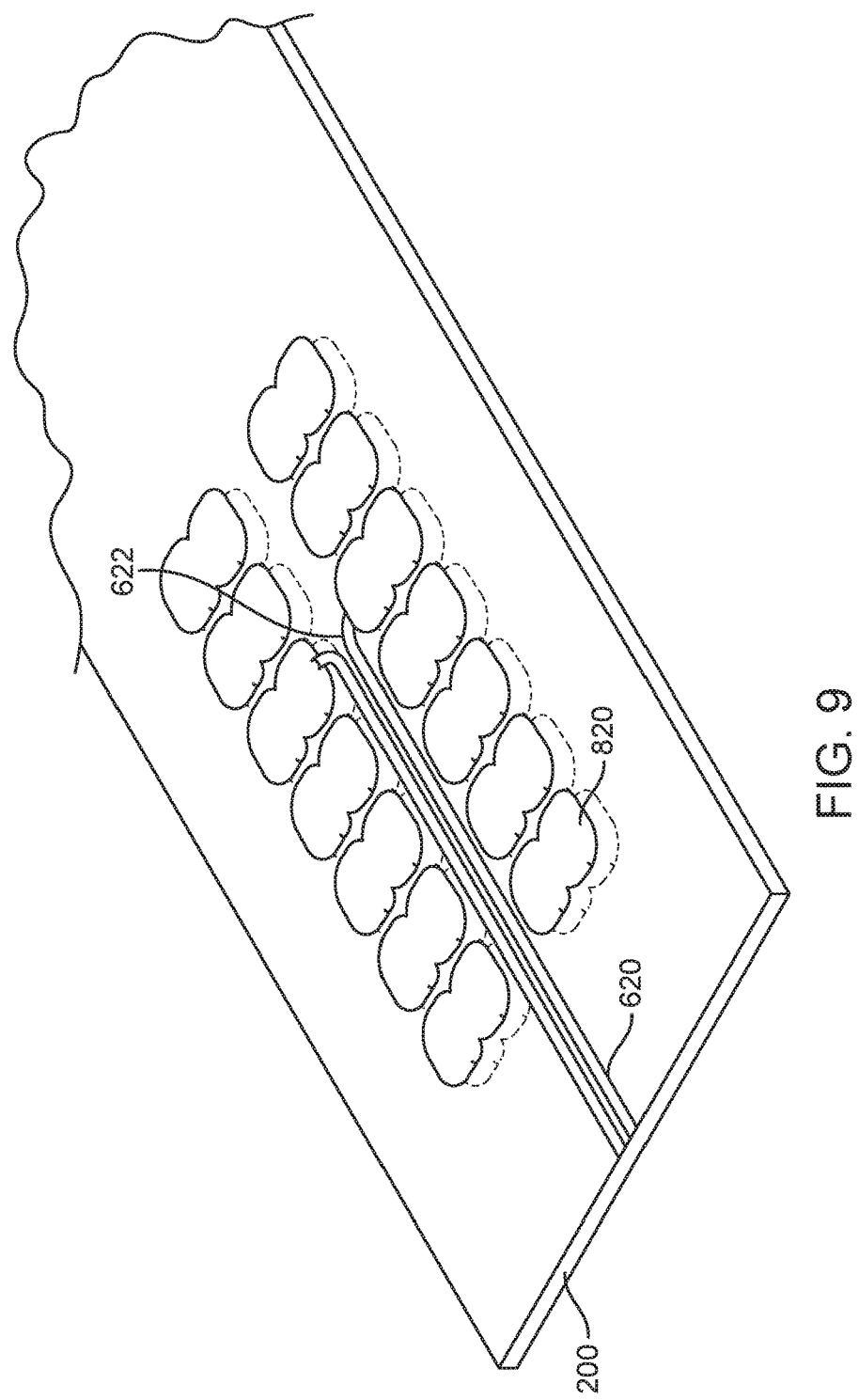
FIGS. 9-13 illustrates a method of forming a portion of a printed circuit board according to an embodiment of the present invention.

FIGS. 9-13 illustrate a method of forming a portion of a printed circuit board according to an embodiment of the present invention. In FIG. 9, horizontal sections 620 for traces may be formed on layers in printed circuit board 200. Pads 820 may also be formed. Pads 820 may eventually form connection points for horizontal traces and vertical segmented vias. Horizontal sections 620 may terminate at pads 820 at terminal portions 622.

Figure 10:
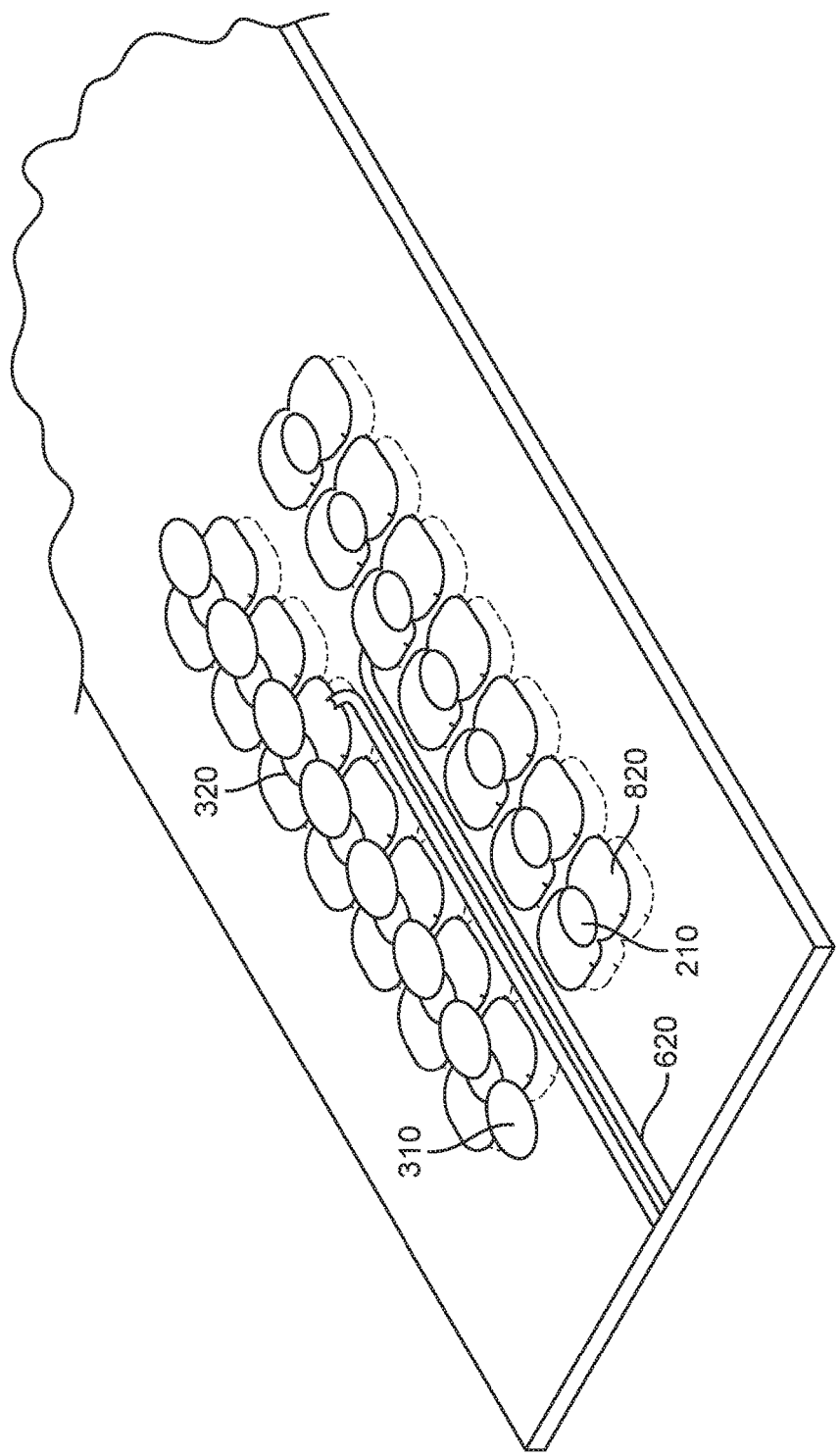

In FIG. 10, segmented vias 320 may be formed as shown above. Specifically, several layers may be laminated together to form a printed circuit board core. First holes 210 may be formed through pads 820, plated, and filled. Second holes 310 may be formed. Second holes may divide the plating of the first holes to form segmented vias 320. Second holes 310 may then be filled. Horizontal sections 620 may physically and electrically connected to one of the segmented vias 320.

Figure 11:
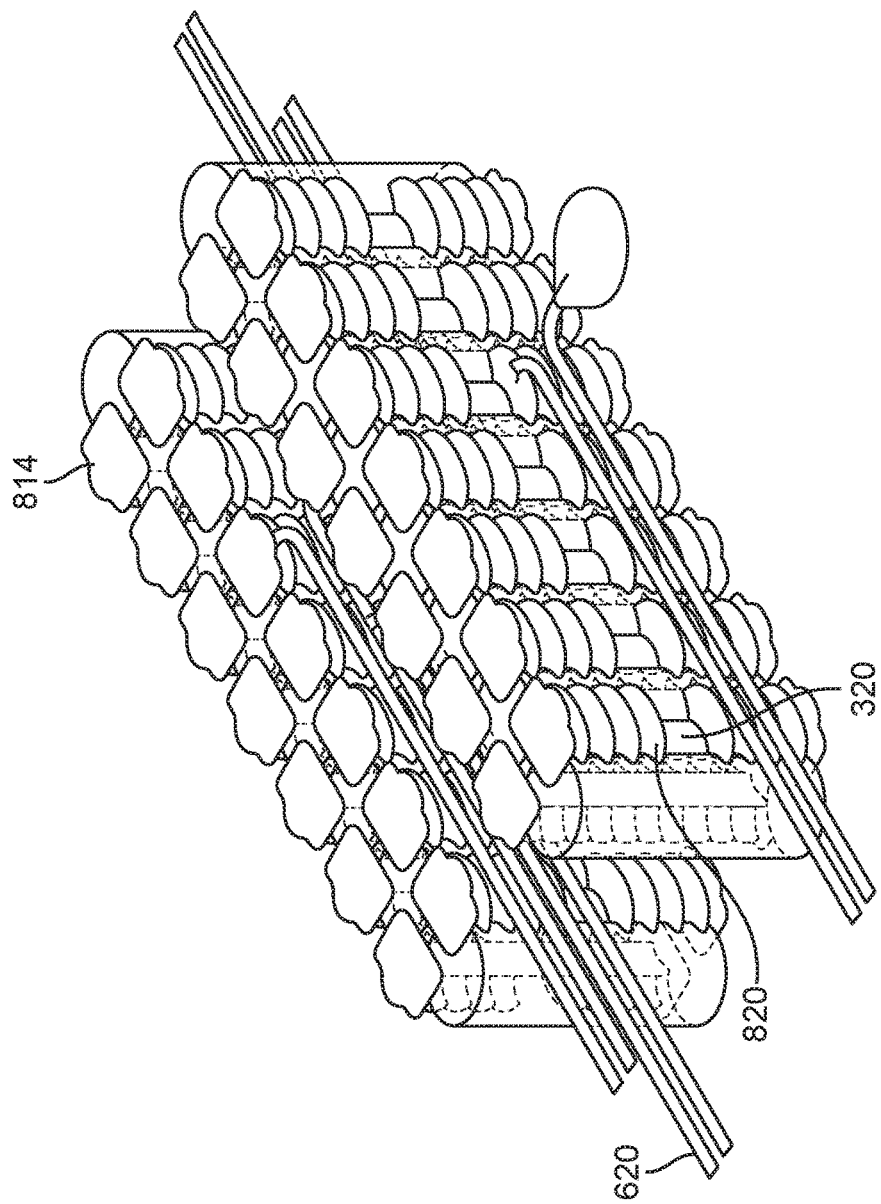
Figure 12:
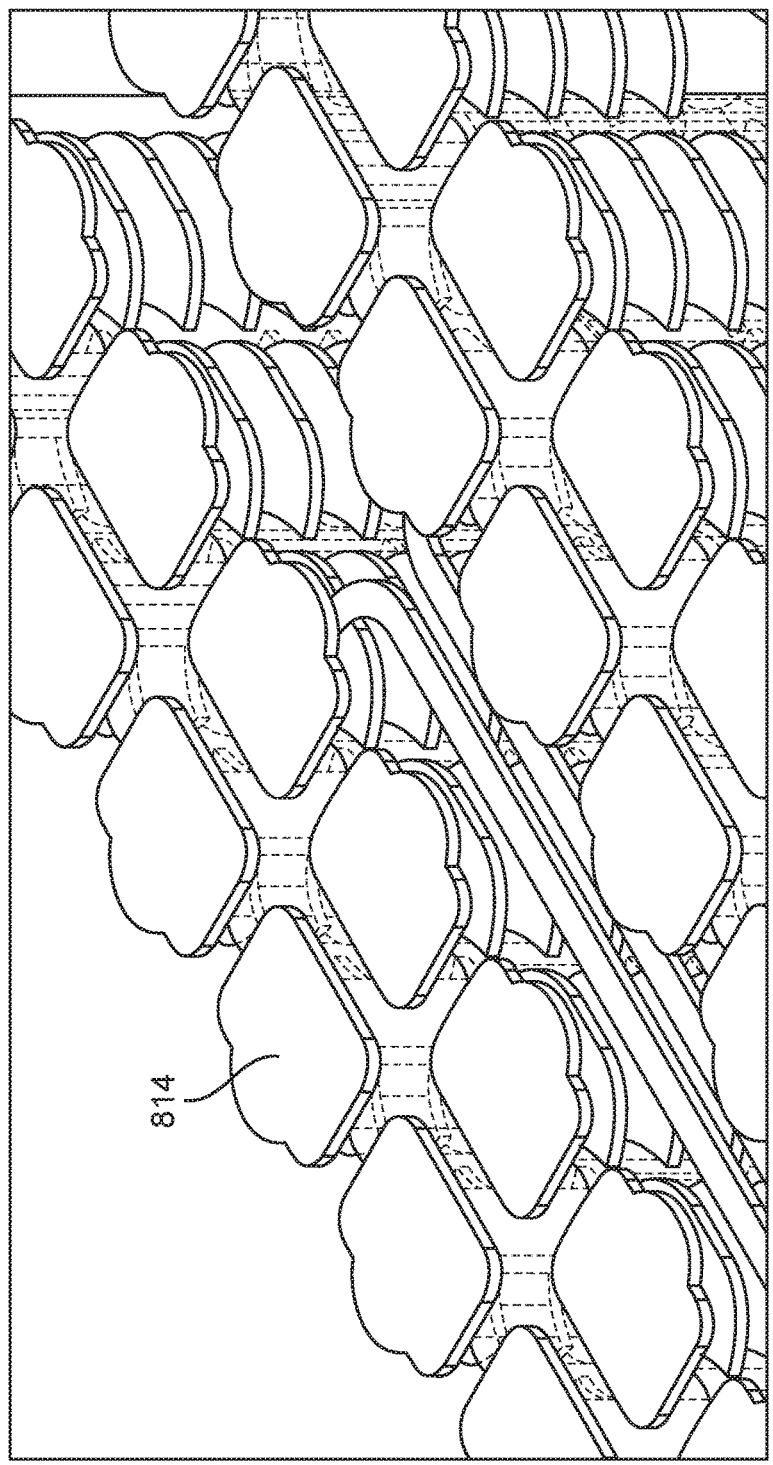

In FIG. 11 connecting portions 814 may be formed on top surfaces of the additional layers. FIG. 12 illustrates a close-up oblique view of connecting portions 814, which have been formed and are electrically connected to segmented vias.

Figure 13:
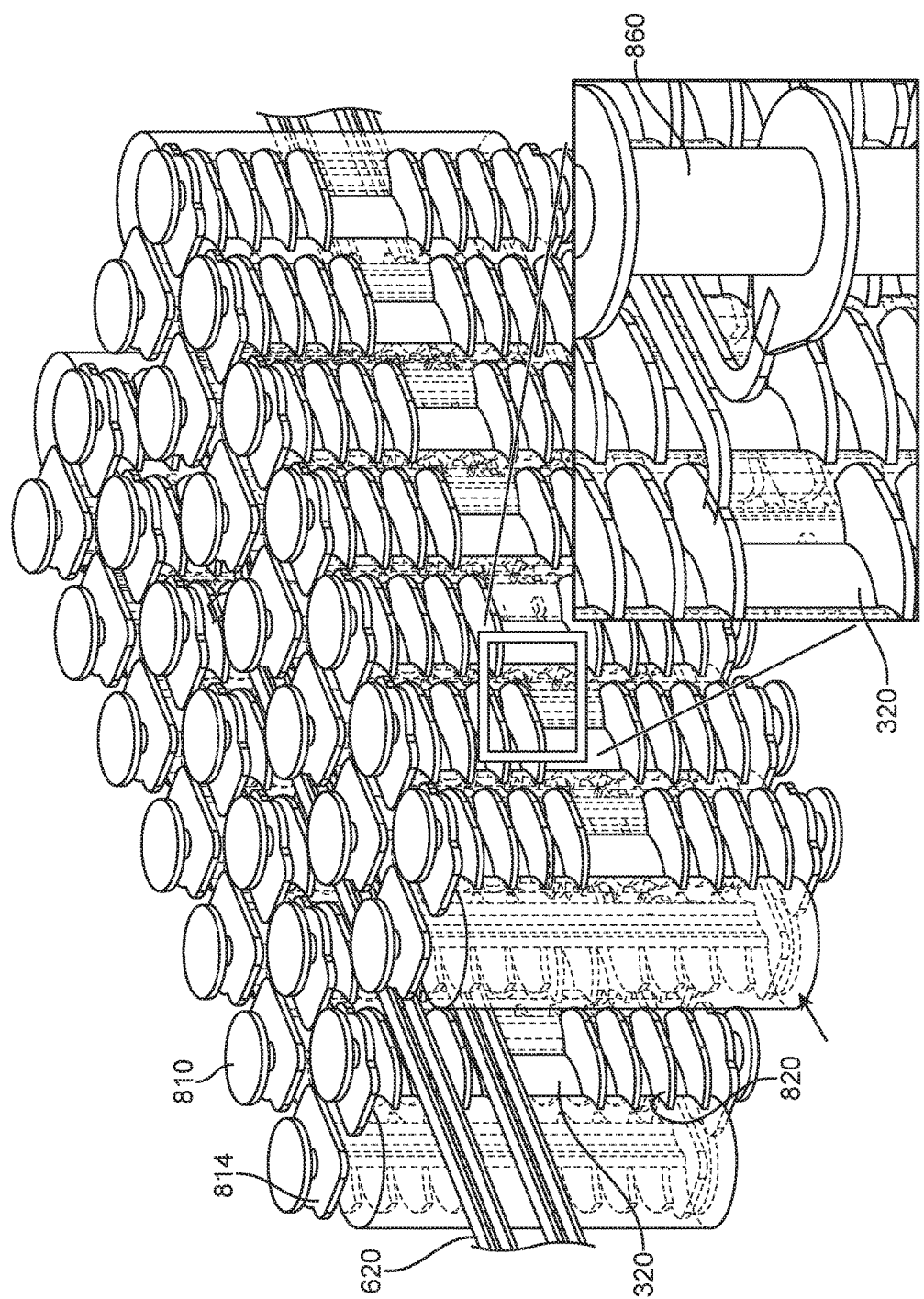

In FIG. 13, one or more additional layers may be laminated onto the top and bottom surfaces of the structure of FIGS. 11 and 12. Contacts 810 may be formed on top surfaces of the additional layers. Contacts 810 may be electrically connected to segmented vias 320 through connecting portions 814. Terminal portion 622 of horizontal sections 620 may terminate in pads 820, which may be connected to segmented vias 320. A via 860 may also be included, and may connect to horizontal interconnect 620.

Figure 14:
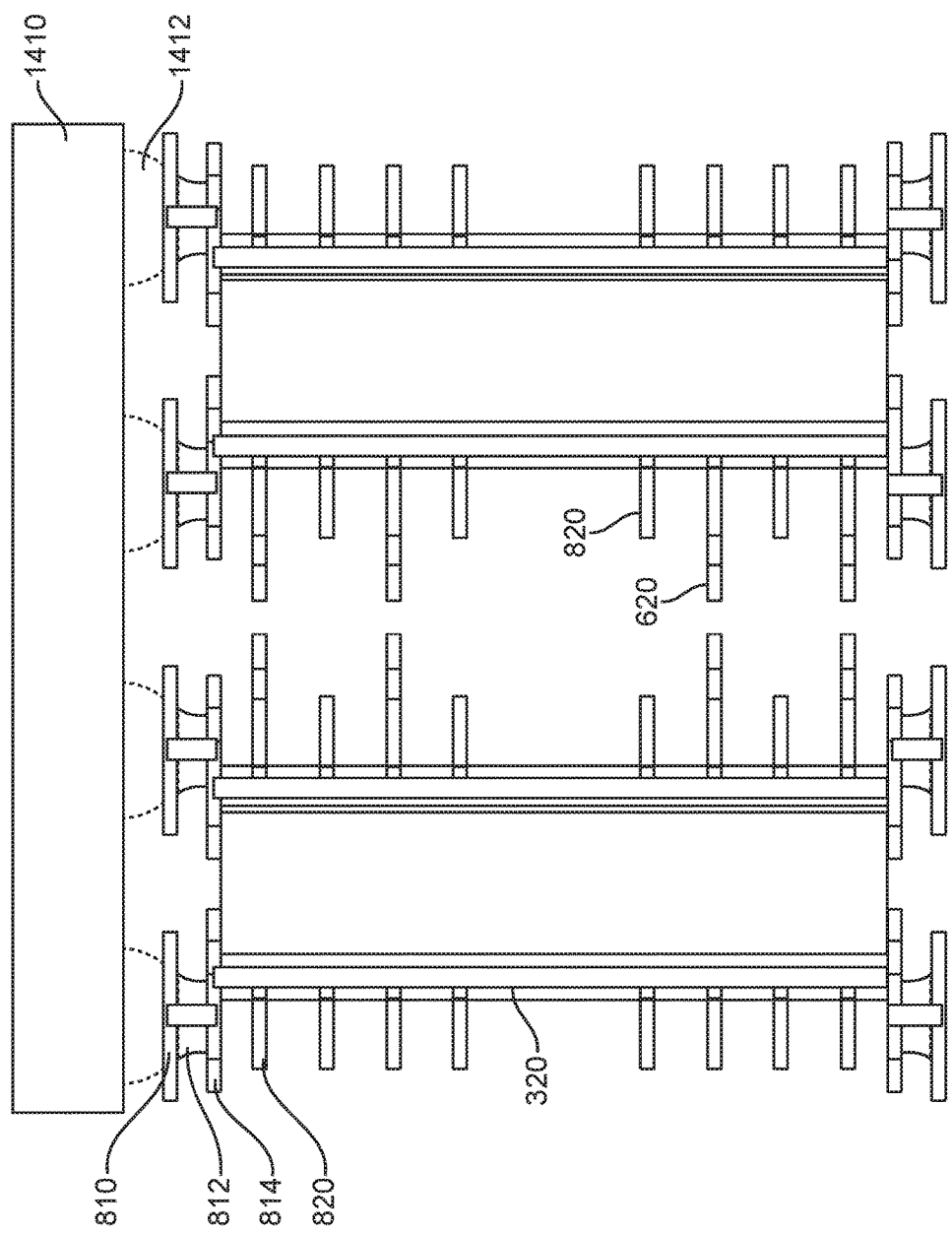
FIG. 14 illustrates a side view of an interconnect structure in a printed circuit board according to an embodiment of the present invention.

FIG. 14 illustrates a side view of an interconnect structure in a printed circuit board according to an embodiment of the present invention. Horizontal sections 620 of interconnect traces for the printed circuit board may be formed on various layers. These horizontal segments 620 may connect to segmented vias 320 through pads 820. Segmented vias 320 may be contacted by a contact structure including connecting portions 814, vias 812, and contacts 810. The contacts 810 and the connecting portions 814 may be separated by a layer of conformal coating, a solder layer, or other appropriate material. Once the printed circuit board is complete, devices 1410 may be mounted on the printed circuit board. Electrical connections may be formed through device contacts 1412 and printed circuit board contacts 810.

Figure 15:
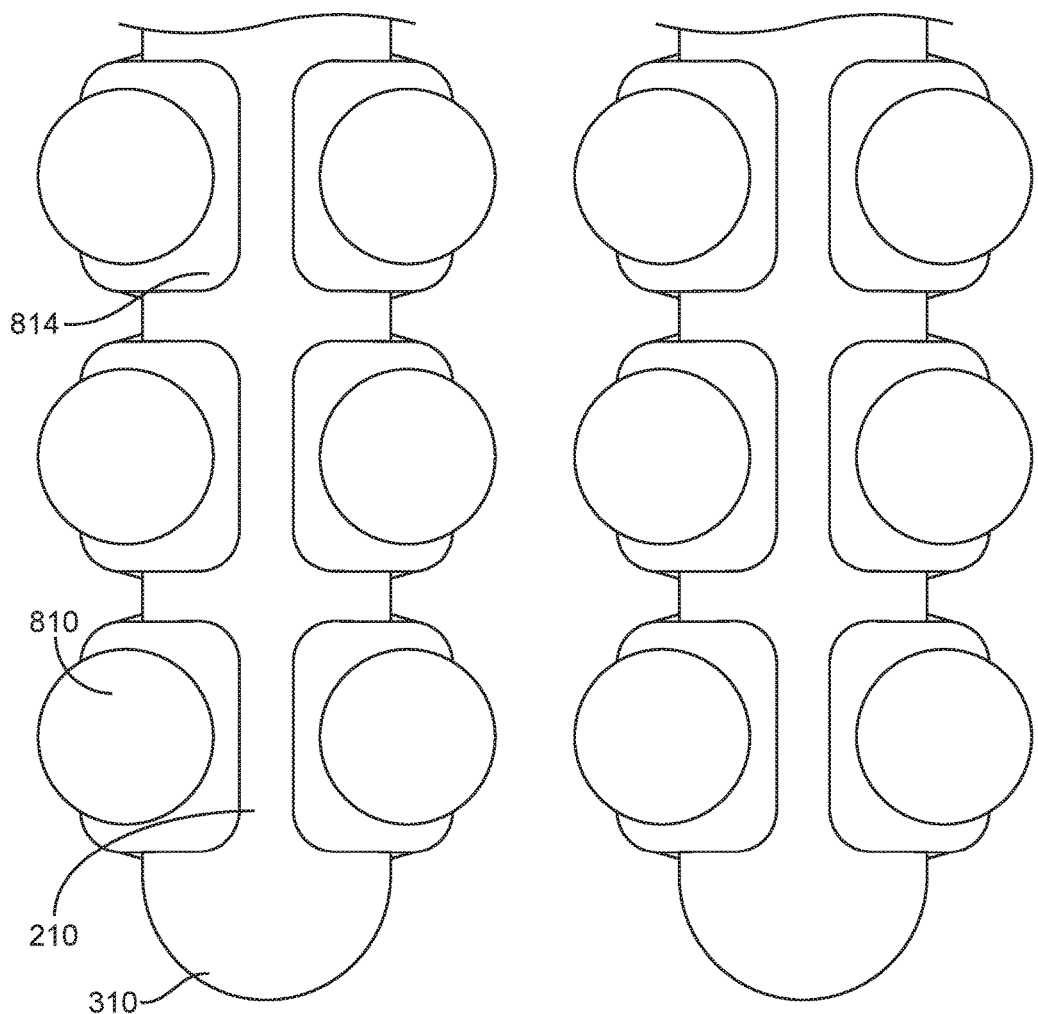
FIG. 15 illustrates a top view of an interconnect structure in a printed circuit board according to an embodiment of the present invention.

FIG. 15 illustrates a top view of an interconnect structure in a printed circuit board according to an embodiment of the present invention. Contacts 810 may connect to segmented vias 320 via connecting portions 814. Segmented vias 320 may be formed by first holes 210 and second holes 310.

Figure 16:
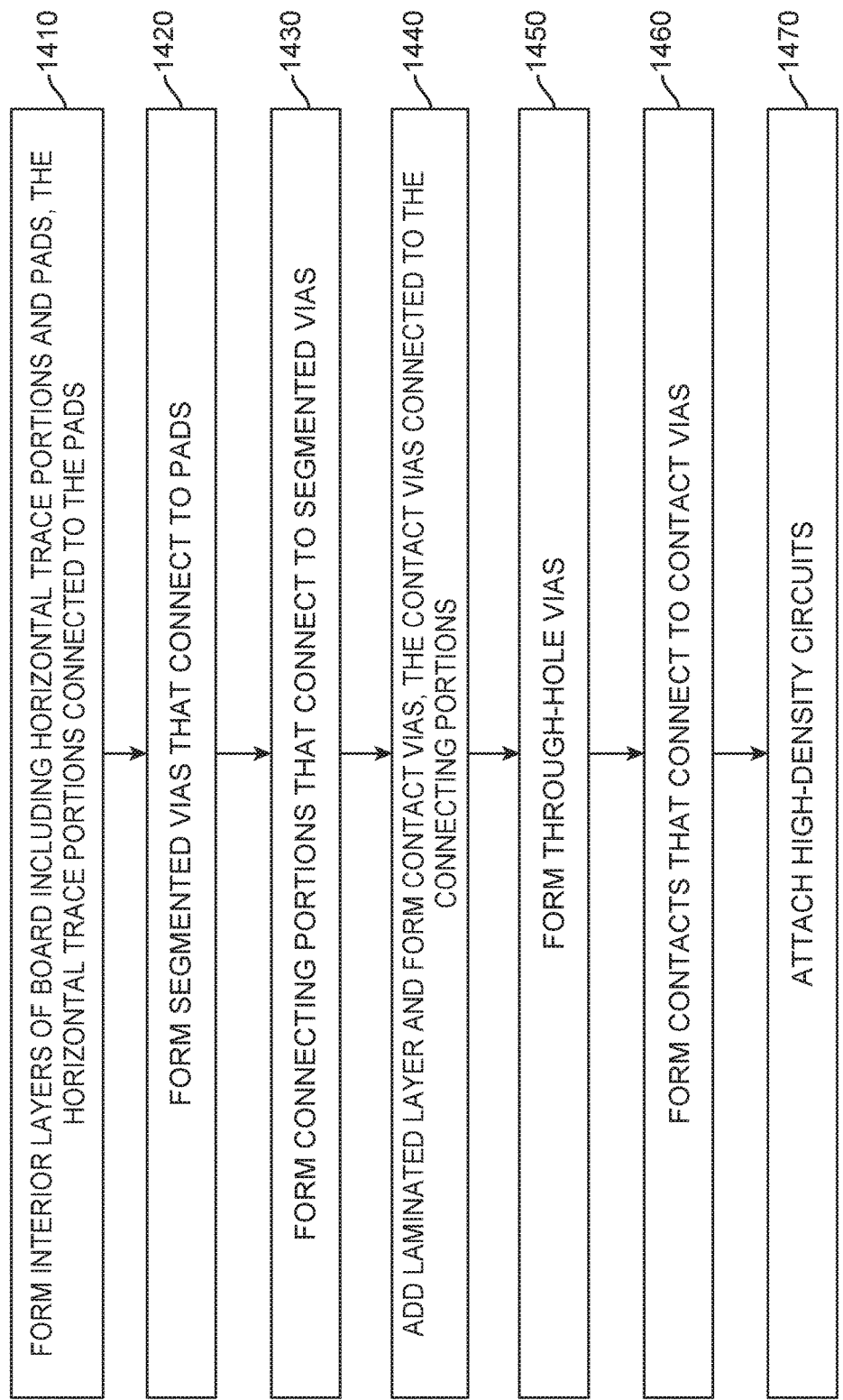
FIG. 16 is a flowchart of a method of forming a printed circuit board according to an embodiment of the present invention.

FIG. 16 is a flowchart of a method of forming a printed circuit board according to an embodiment of the present invention. In act 1610, a number of interior layers for a printed circuit board may be formed. The layers may include horizontal sections for traces and pads. Segmented vias that connect to the pads may be formed in act 1620. A connecting portion layer may be formed in act 1630, where the connecting portions connect to the segmented vias. One or more additional layers and contact vias may be formed in act 1640, where the contact vias connect to the connecting portions. Through-hole vias may be formed in act 1650. Contacts may be plated over the contact vias in act 1660 to form contact structures. High density circuitry, such as an SOIC or SIP module may be attached to the contacts in act 1670.

Figure 17:
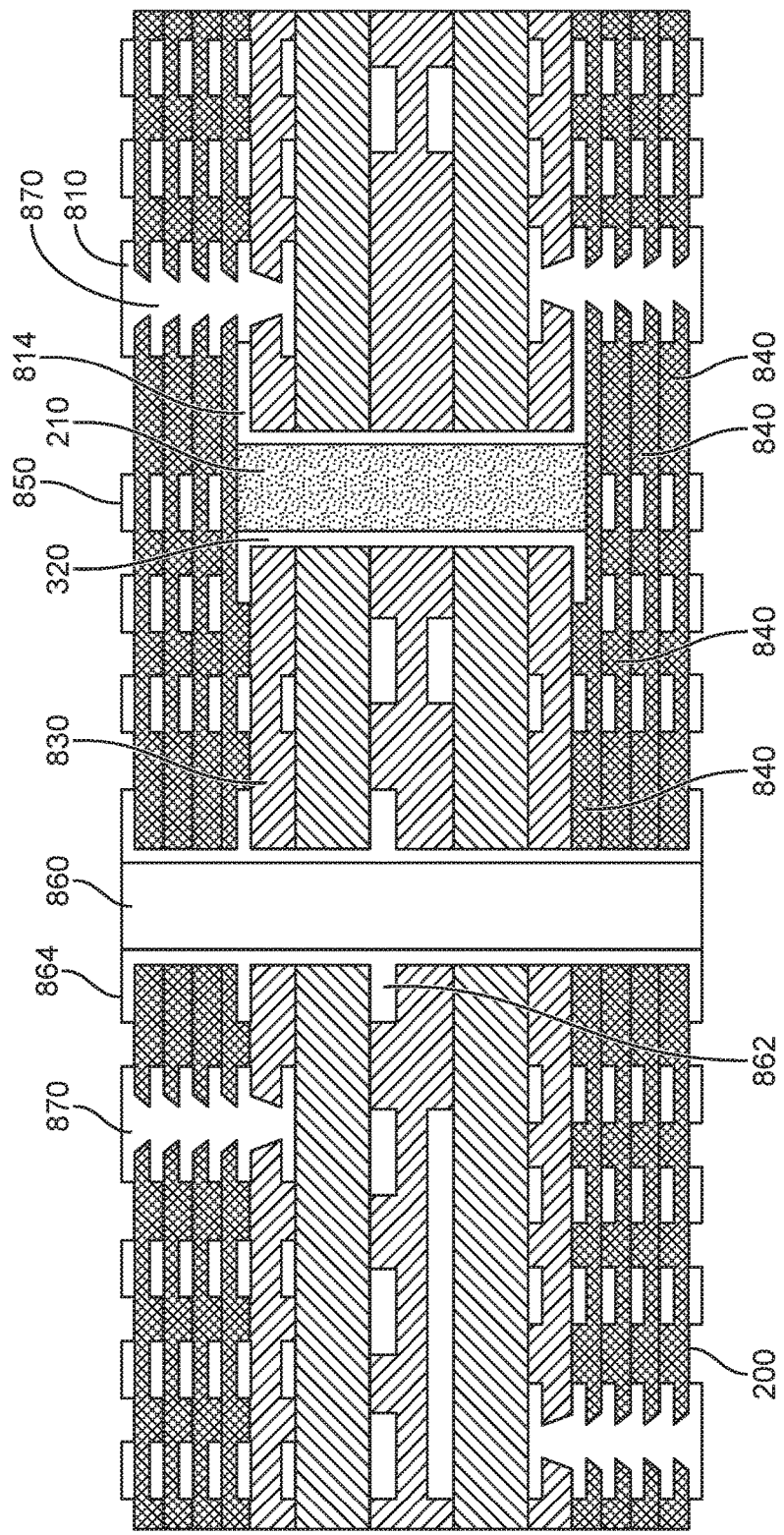
FIG. 17 illustrates a cutaway side view of another printed circuit board according to an embodiment of the present invention.

FIG. 17 illustrates a cutaway side view of another printed circuit board according to an embodiment of the present invention. As before, printed circuit board 200 may include a number of interior layers 830. Interior layers 830 may form a core of printed circuit board 200. Interior layers 830 may include horizontal traces 620, pads 820 and 862, and other structures. Segmented vias 320 may be formed by drilling a first hole 210 in interior layers 830 and plating the resulting hole. The hole may then be filled. The resulting plating may be segmented into segmented vias 320 by drilling second holes 310 as shown above. Connecting portions 814 may be plated on a top and bottom of the printed circuit board core formed by interior layers 830. Connecting portions 814 may electrically connect to segmented vias 320. Buried vias 320 are shown as being segmented here. In these and other embodiments of the present invention, one or more buried vias may be left intact and not segmented.

Additional layers 840 may then be laminated on a top, bottom, or both top and bottom of printed circuit board 200. Through-hole via 860 may be formed by drilling and plating. Pads 862 and 864 may be formed on layers 830 and 840. Traces 850 and contacts 810 may be formed on a top and bottom of printed circuit board 200. Vias in layers 840 may be aligned and may connect to each other to form stacked vias 870. Stacked vias 870 may connect connecting portion 814 to contacts 810.

In various embodiments of the present invention, printed circuit board may have various numbers of layers. For example, printed circuit board 200 may have 5-12, 10-15, 12-20, 12, 14, 16, 18, or more than 20 interior layers 830. Printed circuit board 200 may also have 1, 2, 3, 4, 5, 6, 7, 8, or more than 8 additional layers 840 laminated on interior layers 830.

Figure 18:
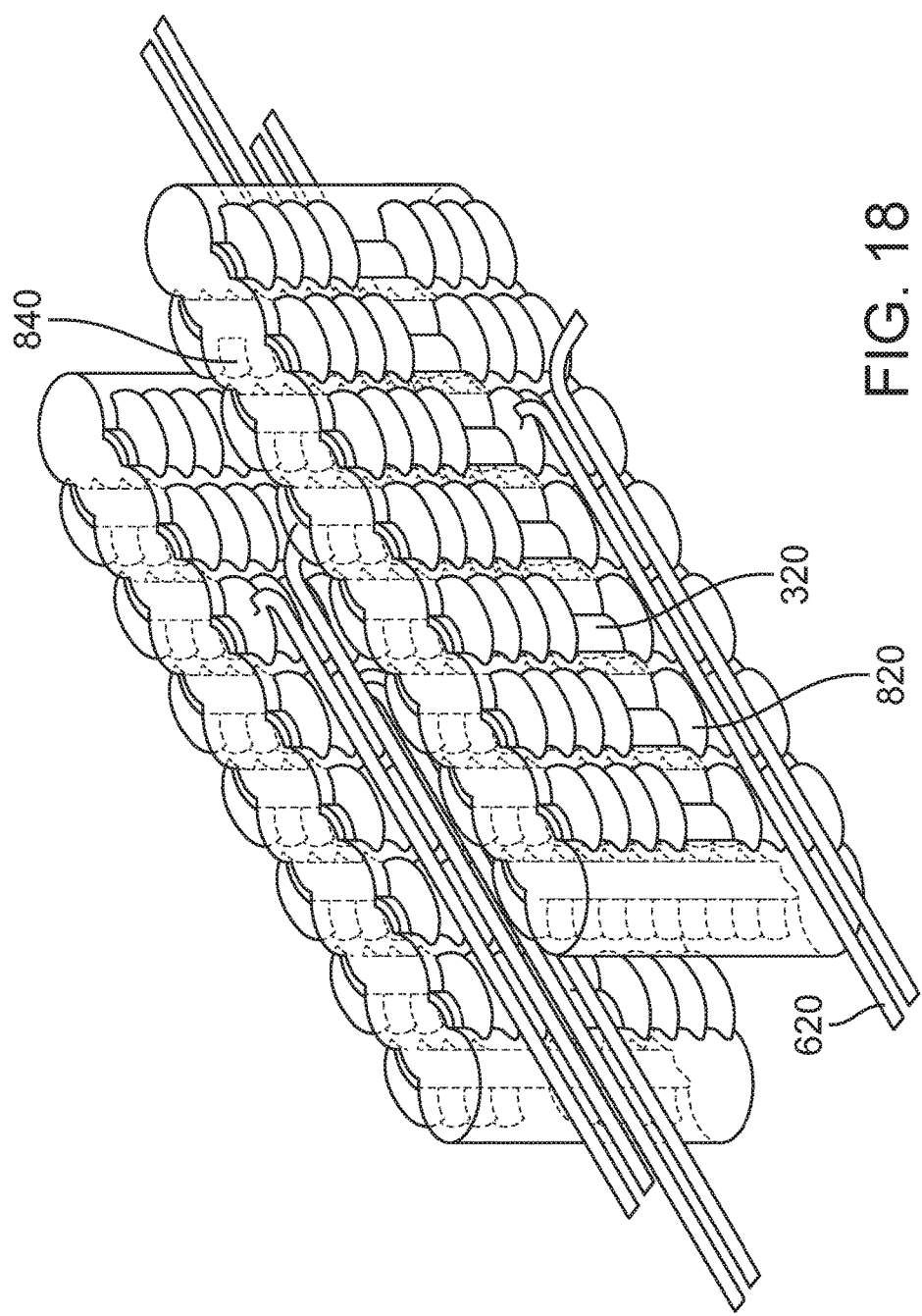
FIG. 18 illustrates an oblique view of an interconnect structure in a printed circuit board according to an embodiment of the present invention.

FIG. 18 illustrates an oblique view of an interconnect structure in a printed circuit board according to an embodiment of the present invention. In this example, horizontal traces 620 may connect to pads 820, which may connect to segmented vias 320. The segmented vias may be absent from additional layers 840.

Figure 19:
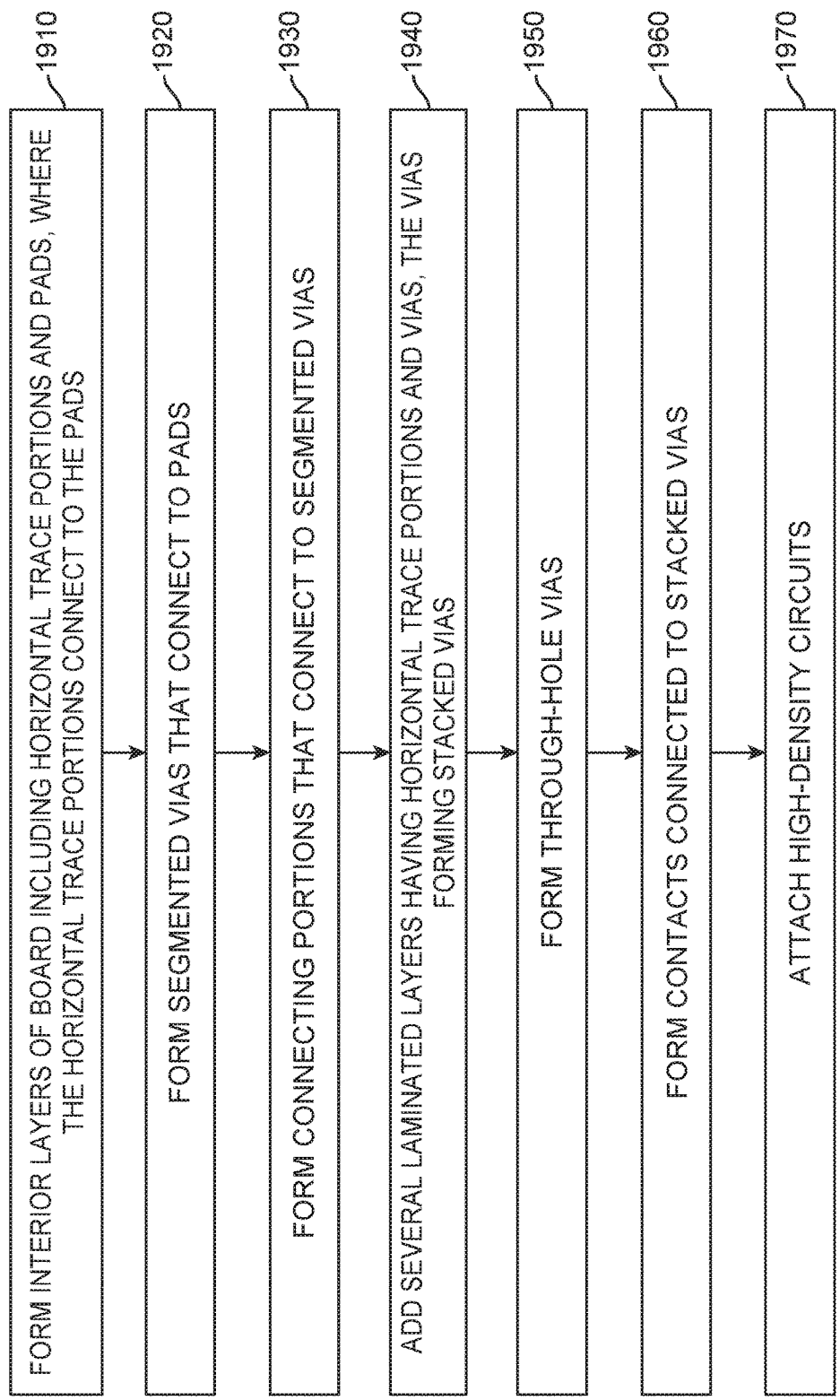
FIG. 19 is another flowchart of a method of forming a printed circuit board according to an embodiment of the present invention.

FIG. 19 is another flowchart of a method of forming a printed circuit board according to an embodiment of the present invention. In act 1910, a number of interior layers for a printed circuit board may be formed. The layers may include horizontal sections for traces and pads, where the horizontal sections connect to the pads. Segmented vias that connect to the pads may be formed in act 1920. A connecting portion layer may be formed in act 1930, where the connecting portions connect to the segmented vias. One or more additional layers having traces and vias may be formed in act 1940. The vias may be aligned and connected to each other to form stacked vias. Through-hole vias may be formed in act 1950. Contacts may be plated over the stacked vias in act 1960 to form contact structures. High density circuitry, such as an SOIC or SIP module may be attached to the contacts in act 1970.

Various materials may be used to form the various features of printed circuit boards according to embodiments of the present invention. For example, the conductive layer used to form vias and segmented vias may be copper, aluminum, gold, or combination of these and other conductive materials. The horizontal sections may be formed of copper, aluminum, gold, or combination of these and other conductive materials. The printed circuit boards may be formed of FR4 or other more advanced materials. The first and second holes may be filled with resin, epoxy, or other material. For example, a material referred to as PHP900 by San-ei Kaguku Co. Ltd., of Japan may be used to fill the first and second holes.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:
1. An electronic device comprising:
a printed circuit board comprising:
a plurality of layers;
a plurality of traces, the plurality of traces formed of horizontal sections on surfaces of the plurality of layers; and
a plurality of vertical sections between the plurality of layers, the plurality of vertical sections including a plurality of segmented vias, wherein the plurality of segmented vias are formed by:

forming a first plurality of holes in the printed circuit board, each of the first plurality of holes extending from a top surface of the printed circuit board into the printed circuit board;
plating the first plurality of holes;
filling the first plurality of holes;
forming a second plurality of holes in the printed circuit board, each of the second plurality of holes extending from the top surface of the printed circuit board into the printed circuit board, each of the second plurality of holes between adjacent holes in the first plurality of holes, wherein each of the second plurality of holes removes a portion of the plating of two adjacent holes in the first plurality of holes such that the plating of each of the first plurality of holes forms two segmented vias; and
filling the second plurality of holes.

2. The electronic device of claim 1 wherein each of the plurality of segmented vias extend through interior layers of the printed circuit board.

3. The electronic device of claim 2 wherein filling the first plurality of holes and filling the second plurality of holes comprises filling the first plurality of holes and filling the second plurality of holes with resin.

4. The electronic device of claim 2 wherein filling the first plurality of holes and filling the second plurality of holes comprises filling the first plurality of holes and filling the second plurality of holes with an epoxy.

5. The electronic device of claim 2 wherein filling the first plurality of holes comprises filling the first plurality of holes with a first type of resin and filling the second plurality of holes comprises filling the second plurality of holes with a second type of resin.

6. The electronic device of claim 2 further comprising a plurality of contacts formed on the top surface of the printed circuit board and electrically connected to the plurality of segmented vias.

7. The electronic device of claim 6 wherein the plurality of contacts are contacts to connect to a ball grid array of an electronic circuit.

8. A method of manufacturing a printed circuit board for an electronic device, the printed circuit board comprising a plurality of layers and a plurality of traces, the plurality of traces formed of horizontal sections on surfaces of the plurality of layers and a plurality of vertical sections between the plurality of layers, the plurality of vertical sections including a plurality of segmented vias, wherein the plurality of segmented vias are formed by the method comprising:
forming a first plurality of holes in the printed circuit board, each of the first plurality of holes extending from a top surface of the printed circuit board into the printed circuit board;
plating the first plurality of holes;
filling the first plurality of holes;
forming a second plurality of holes in the printed circuit board, each of the second plurality of holes extending from the top surface of the printed circuit board into the printed circuit board, each of the second plurality of holes between adjacent holes in the first plurality of holes, wherein each of the second plurality of holes removes a portion of the plating of two adjacent holes in the first plurality of holes such that the plating of each of the first plurality of holes forms two segmented vias; and
filling the second plurality of holes.

9. The method of claim 8 wherein each of the first plurality of holes and each of the second plurality of holes extend through interior layers of the printed circuit board.

10. The method of claim 9 wherein filling the first plurality of holes and filling the second plurality of holes comprises filling the first plurality of holes and filling the second plurality of holes with resin.

11. The method of claim 9 wherein filling the first plurality of holes and filling the second plurality of holes comprises filling the first plurality of holes and filling the second plurality of holes with an epoxy.

12. The method of claim 9 wherein filling the first plurality of holes comprises filling the first plurality of holes with a first type of resin and filling the second plurality of holes comprises filling the second plurality of holes with a second type of resin.

13. The method of claim 9 wherein forming the first plurality of holes and forming the second plurality of holes is done by drilling.

14. The method of claim 9 further comprising:
before filling the first plurality of holes, micro-etching the plated first plurality of holes.

15. The method of claim 9 further comprising, after filling the first plurality of holes, planarizing a surface of the printed circuit board.

16. The method of claim 9 wherein each of the first plurality of holes have a smaller diameter than each of the second plurality of holes.

17. An electronic device comprising:
a printed circuit board comprising:
a plurality of layers;
a plurality of traces, the plurality of traces formed of horizontal sections on surfaces of the plurality of layers; and
a plurality of vertical sections between the plurality of layers, the plurality of vertical sections including a plurality of segmented vias, the plurality of segmented vias including a first segmented via, a second segmented via, and a third segmented via; and
a region of resin fill between and adjacent to the first segmented via and the second segmented via, the first segmented via spaced from the second segmented via in a first direction, and between and adjacent to the first segmented via and the third segmented via, the first segmented via spaced from the third segmented via in a second direction, the first direction orthogonal to the second direction.

18. The electronic device of claim 17 wherein each of the plurality of segmented vias extend through interior layers of the printed circuit board.

19. The electronic device of claim 18 further comprising a plurality of contacts formed on a top surface of the printed circuit board and electrically connected to the plurality of segmented vias.

20. The electronic device of claim 18 wherein the region of resin fill comprises a first material between the first segmented via and the second segmented via, and a second material between the first segmented via and the third segmented via.

* * * * *